United States Patent
Wang et al.

(10) Patent No.: US 7,435,658 B2
(45) Date of Patent: *Oct. 14, 2008

(54) METHOD OF MANUFACTURING METAL-OXIDE-SEMICONDUCTOR TRANSISTOR

(75) Inventors: Yu-Ren Wang, Tainan (TW); Chin-Cheng Chien, Chiai (TW); Hsiang-Ying Wang, Chiai (TW); Neng-Hui Yang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 578 days.

This patent is subject to a terminal disclaimer.

(21) Appl. No.: 11/147,506

(22) Filed: Jun. 7, 2005

(65) Prior Publication Data

US 2005/0272213 A1 Dec. 8, 2005

Related U.S. Application Data

(63) Continuation of application No. 10/667,229, filed on Sep. 17, 2003, now Pat. No. 6,943,085.

(30) Foreign Application Priority Data

Sep. 4, 2003 (TW) .............................. 92124424 A

(51) Int. Cl.
    *H01L 21/336* (2006.01)

(52) U.S. Cl. ............... 438/308; 438/486; 257/E21.336; 257/E21.41

(58) Field of Classification Search ................. 438/301, 438/303, 305–308, 486, 595
    See application file for complete search history.

(56) References Cited

U.S. PATENT DOCUMENTS 6,660,605 B1 * 12/2003 Liu .............................. 438/307
6,943,085 B2 * 9/2005 Wang et al. .................. 438/305

* cited by examiner

*Primary Examiner*—Quoc D Hoang
(74) *Attorney, Agent, or Firm*—J.C. Patents

(57) ABSTRACT

A method of manufacturing a MOS transistor is provided. A substrate having a gate structure thereon is provided. A first spacer is formed on the sidewall of the gate structure. A pre-amorphization implantation is carried out to amorphize a portion of the substrate. A doped source/drain extension region is formed in the substrate on each side of the first spacer. A second spacer is formed on the sidewall of the first spacer. A doped source/drain region is formed in the substrate on each side of the second spacer. Thereafter, a solid phase epitaxial process is carried out to re-crystallize the amorphized portion of the substrate and activate the doped source/drain extension region and the doped source/drain region to form a source/drain terminal. Finally, a post-annealing operation is performed.

6 Claims, 5 Drawing Sheets

METHOD OF MANUFACTURING METAL-OXIDE-SEMICONDUCTOR TRANSISTOR

CROSS-REFERENCE TO RELATED APPLICATION

This application is a continuation of a prior application Ser. No. 10/667,229, filed Sep. 17, 2003 now U.S. Pat. No. 6,943,085. The prior application Ser. No. 10/667,229 This application claims the priority benefit of Taiwan application Ser. No. 92124424, filed on Sep. 4, 2003.

BACKGROUND OF THE INVENTION

1. Field of Invention

The present invention relates to a method of manufacturing a semiconductor device. More particularly, the present invention relates to a method of manufacturing a metal-oxide-semiconductor (MOS) transistor.

2. Description of Related Art

As the level of integration in integrated circuits continues to increase, area occupation of each semiconductor device is reduced. Consequently, the specification in circuit design must be changed to reflect such reduction. At present, integrated circuits are designed to have feature dimensions in the deep sub-micron range. However, as the integrated circuit device such as a deep sub-micron metal-oxide-semiconductor (MOS) device is miniaturized, depth of the source/drain terminal within a substrate must be reduced in a corresponding way. Yet, the reduction of the junction depth of the source/drain terminal must not result in any increase in resistance. In fact, the capacity to produce a source/drain terminal with all the desired specifications is a major factor that determines the ultimate quality of a MOS transistor.

The conventional method of fabricating a MOS transistor involves the following steps. First, a pre-amorphization implantation is carried out on a substrate having a gate structure thereon. Thereafter, an extension region and doped source/drain region are sequentially formed in the substrate. A rapid thermal annealing operation is carried out to initiate a re-crystallization of silicon in the amorphized region and activate the dopants within the extension region and the doped source/drain region to form a source/drain terminal. The annealing operation is carried out a high temperature of between 800° C. to 900° C. Although the pre-amorphization implantation is able to lower the channel effect due to the dopants, the diffusion of dopants cannot be prevented.

Another conventional method of fabricating a MOS transistor involves the following steps. First, an amorphization implantation using germanium ions is carried out on a substrate with a gate structure thereon. Thereafter, an extension region and doped source/drain region are sequentially formed within the amorphized region of the substrate. A solid phase epitaxial fabrication process is carried out to re-crystallize the silicon in the amorphized region and activate the dopants within the extension region and the doped source/drain region to form a source/drain terminal. However, the resistance at the source/drain terminal is still relatively high and the saturated drain current is still relatively low for a MOS transistor fabricated using this method.

SUMMARY OF THE INVENTION

Accordingly, one object of the present invention is to provide a method of manufacturing a metal-oxide-semiconductor (MOS) transistor capable of reducing sheet resistance at the source/drain terminal of the transistor.

A second object of this invention is to provide a method of manufacturing a metal-oxide-semiconductor (MOS) transistor capable of improving the electrical properties of the transistor.

To achieve these and other advantages and in accordance with the purpose of the invention, as embodied and broadly described herein, the invention provides a method of manufacturing a MOS transistor. First, a substrate having a gate structure thereon is provided. A spacer is formed on the sidewalls of the gate structure. Thereafter, a pre-amorphization implantation is carried out to amorphize a portion of the substrate. A doped source/drain extension region is formed in the substrate on each side of the first spacer. A second spacer is formed on the sidewall of the first spacer and then a doped source/drain region is formed in the substrate on each side of the second spacer. Next, a pre-annealing operation is carried out. Thereafter, a solid phase epitaxial process is performed to re-crystallize the amorphized portion of the substrate and activate the doped source/drain extension region and the doped source/drain region to form a source/drain terminal. The pre-annealing operation is carried out at a temperature lower than the operating temperature in the solid phase epitaxial process.

This invention also provides a second method of manufacturing a MOS transistor. First, a substrate having a gate structure thereon is provided. Thereafter, a first spacer is formed on the sidewall of the gate structure. A pre-amorphization implantation is carried out so that a portion of the substrate is amorphized. A doped source/drain extension region is formed in the substrate on each side of the first spacer. A second spacer is formed on the sidewall of the first spacer and then a doped source/drain region is formed in the substrate on each side of the second spacer. A solid phase epitaxial process is carried out to re-crystallize the amorphized region of the substrate and activate the doped source/drain extension region and the doped source/drain region to form a source/drain terminal. Finally, a post-annealing operation is carried out at an annealing temperature greater than the operating temperature in the solid state epitaxial process.

This invention also provides a third method of manufacturing a MOS transistor. First, a substrate having a gate structure thereon is provided. Thereafter, a first spacer is formed on the sidewalls of the gate structure. A pre-amorphization implantation is carried out to amorphize a portion of the substrate. A doped source/drain extension region is formed in the substrate on each side of the first spacer. A second spacer is formed on the sidewall of the first spacer. Next, a doped source/drain region is formed in the substrate on each side of the second spacer. A pre-annealing operation is carried out. Thereafter, a solid phase epitaxial process is carried out to re-crystallize the amorphized portion of the substrate and activate the doped source/drain extension region and the doped source/drain region to form a source/drain terminal. The pre-annealing operation is carried out at an annealing temperature smaller than the operating temperature in the solid state epitaxial process. Finally, a post-annealing operation is carried out at an annealing temperature greater than the operating temperature in the solid state epitaxial process.

In this invention, a pre-annealing operation is carried out before the solid phase epitaxial process so that the amorphized region is re-crystallized to form large crystals. Hence, sheet resistance at the source/drain terminal of the MOS transistor is greatly reduced.

Furthermore, a post-annealing operation is carried out after the solid phase epitaxial process so that the distance between the source/drain region and the extension region of the transistor is reduced. Thus, the electrical performance of the transistor is greatly improved.

In addition, the MOS transistor of this invention utilizes a solid phase epitaxial process to activate the dopants within the source/drain region. Since the solid phase epitaxial process has a low thermal budget, transition stage acceleration and short channel effect resulting from using a high-temperature annealing process can be prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

Figure 1:
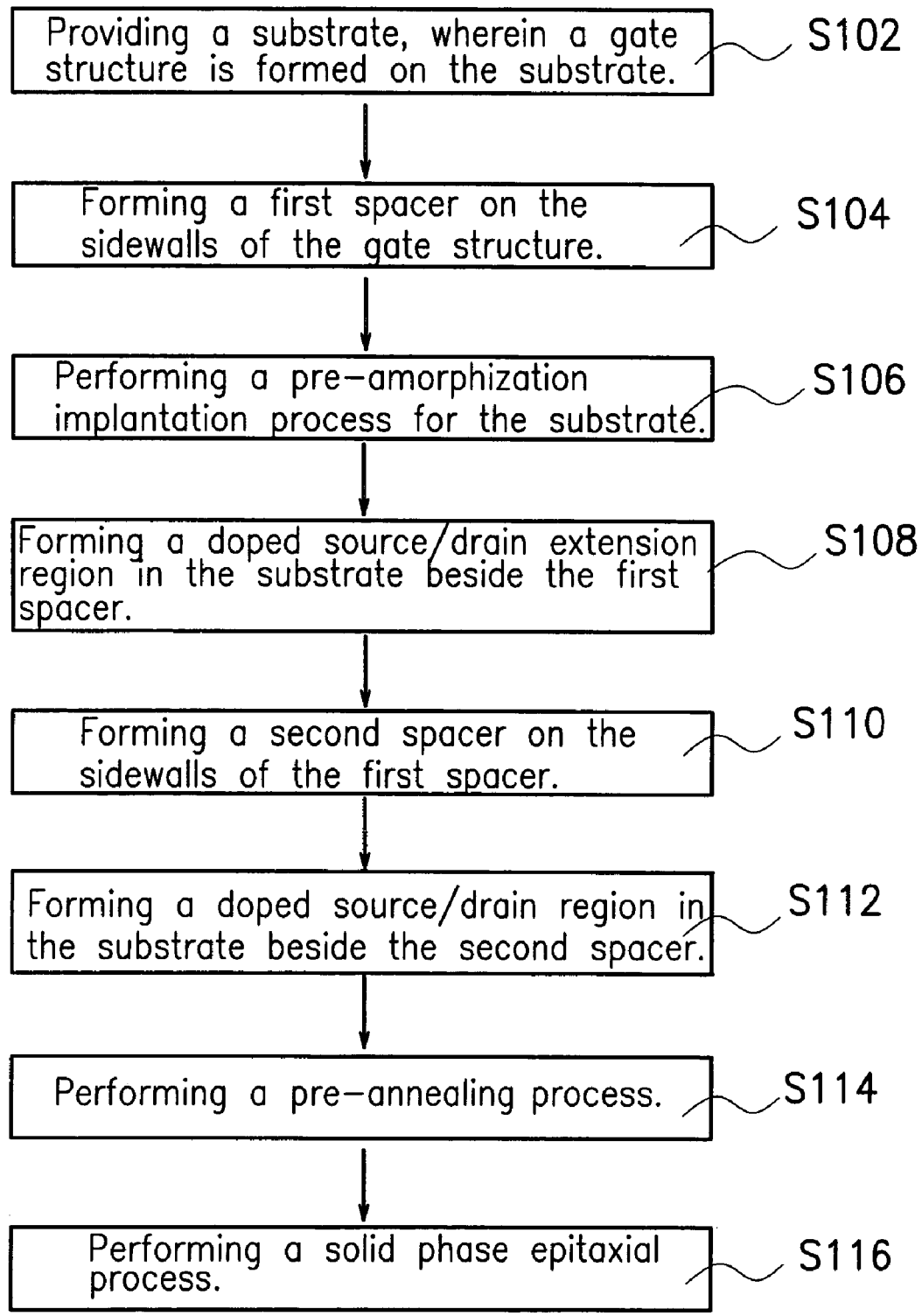
FIG. 1 is a flowchart showing the steps for fabricating a metal-oxide-semiconductor transistor according to a first preferred embodiment of this invention.

DESCRIPTION OF THE PREFERRED
EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flowchart showing the steps for fabricating a metal-oxide-semiconductor transistor according to a first preferred embodiment of this invention.

Figure 2A:
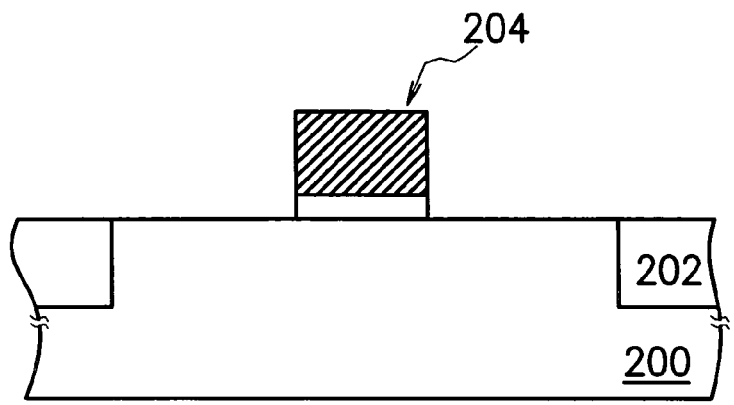
FIGS. 2A to 2E are schematic cross-sectional views showing the progression of steps for fabricating a metal-oxide-semiconductor transistor according to the preferred embodiment of this invention.

FIGS. 2A to 2E are schematic cross-sectional views showing the progression of steps for fabricating a metal-oxide-semiconductor transistor according to the preferred embodiment of this invention. First, as shown in FIG. 2A and step S102 of FIG. 1, a substrate 200 such as a silicon substrate with a shallow trench isolation region 202 therein and a gate structure 204 comprising a gate insulation layer and a gate thereon is formed over the substrate 200.

Thereafter, in step S104 of FIG. 1, a first spacer 205 is formed on the sidewalls of the gate structure 204. The first spacer 205 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas.

Figure 2B:
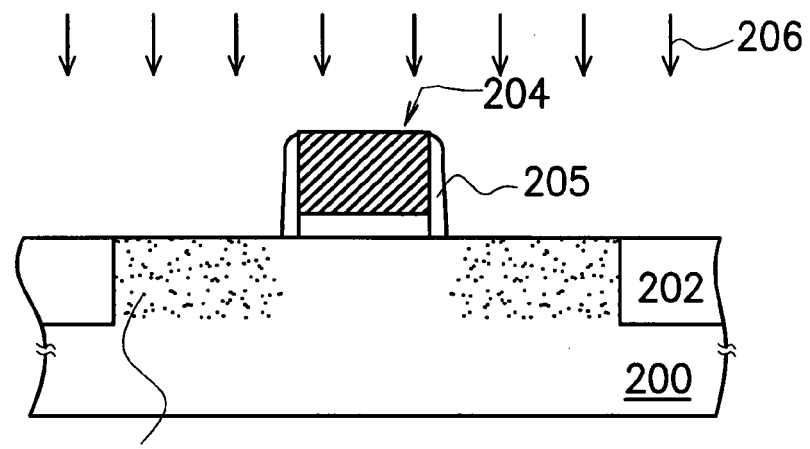

As shown in FIG. 2B and step S106 of FIG. 1, a pre-amorphization implantation 206 of the substrate 200 is carried out using dopants including, for example, germanium ions. The pre-amorphization implantation 206 is an ion implantation that implants germanium ions into the substrate 200 to form an amorphized region 208. In the pre-amorphization implantation 206, germanium ions are implanted at a dosage level between $2*10^{14}$ atoms/cm$^2$ to $1*10^{15}$ atoms/cm$^2$ and at an implantation energy level between 25 KeV to 45 KeV.

Figure 2C:
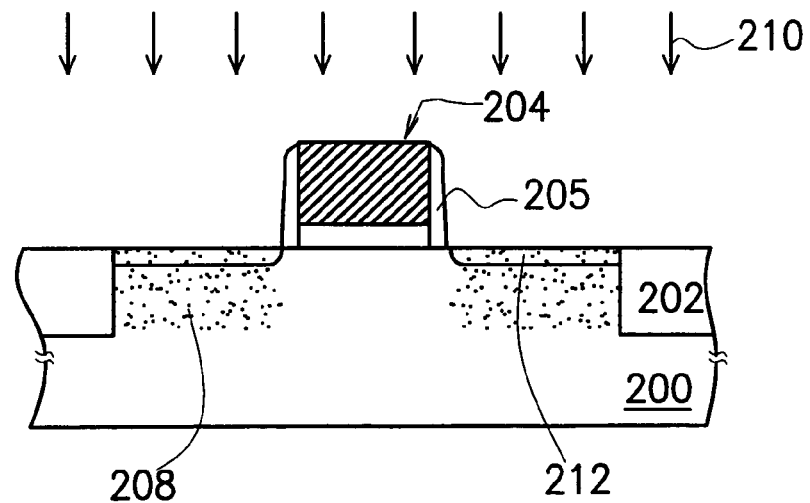

As shown in FIG. 2C and step S108 in FIG. 1, a doped source/drain extension region 212 is formed in the substrate 200 on each side of the first spacer 205. The doped source/drain extension region 212 is formed, for example, by performing an ion implantation process 210 using the gate structure 204 and the first spacer 205 as a mask. In the ion implantation 210, N-type or P-type ions can be used according to the desired state of the device. If N-type ions such as arsenic are used in the implantation, an implantation dosage of between $5*10^{14}$ atoms/cm$^2$ to $2*10^{15}$ atoms/cm$^2$ and an implantation energy level of between 3 to 5 KeV can be used. On the other hand, if P-type ions such as fluoroboride ions are used, an implantation dosage of between $5*10^{14}$ atoms/cm$^2$ to $2*10^{15}$ atoms/cm$^2$ and an implantation energy level of between 1 to 2 KeV can be used.

Figure 2D:
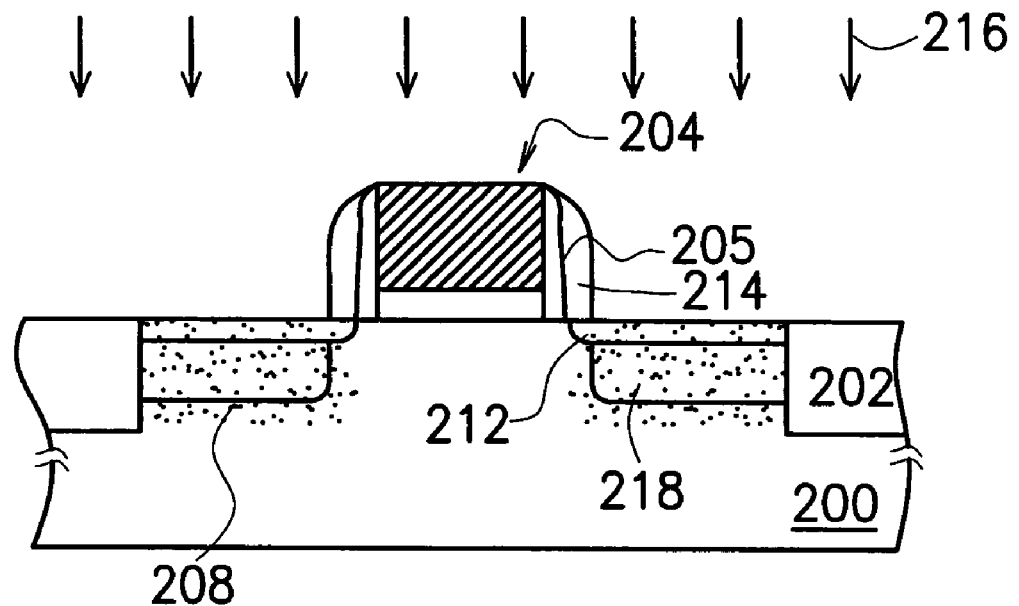

As shown in FIG. 2D and in step S110 in FIG. 1, a second spacer 214 is formed on the sidewall of the first spacer 205. The second spacer 214 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas. Alternatively, the second spacer 214 is formed, for example, by performing a rapid thermal annealing process or heating inside a furnace at a temperature exceeding 700° C. Thereafter, germanium ions are implanted into the substrate 200 to break up any re-crystallized silicon in the amorphized region 208 during the annealing operation.

As shown in FIG. 2D and step S112 in FIG. 1, a doped source/drain region 218 is formed in the substrate 200 on each side of the second spacer 214. The doped source/drain region 218 is formed, for example, by performing an ion implantation process 216 using the gate structure 204, the first spacer 205 and the second spacer 214 as a mask. In the ion implantation 216, N-type or P-type ions can be used according to desired state of the device. If N-type ions such as phosphorus ions are used in the implantation, an implantation dosage of between $2*10^{13}$ atoms/cm$^2$ to $4*10^{13}$ atoms/cm$^2$ and an implantation energy level of between 35 to 45 KeV can be used. If N-type ions such as arsenic ions are used in the implantation, an implantation dosage of between $2*10^{15}$ atoms/cm$^2$ to $4*10^{15}$ atoms/cm$^2$ and an implantation energy level of between 35 to 45 KeV can be used. On the other hand, if P-type ions such as boron ions are used, an implantation dosage of between $7*10^{13}$ atoms/cm$^2$ to $4*10^{15}$ atoms/cm$^2$ and an implantation energy level of between 5 to 12 KeV can be used. If P-type ions such as fluoroboride ions are used, an implantation dosage of between $5*10^{14}$ atoms/cm$^2$ to $1*10^{15}$ atoms/cm$^2$ and an implantation energy level of between 12 to 18 KeV can be used.

Figure 2E:
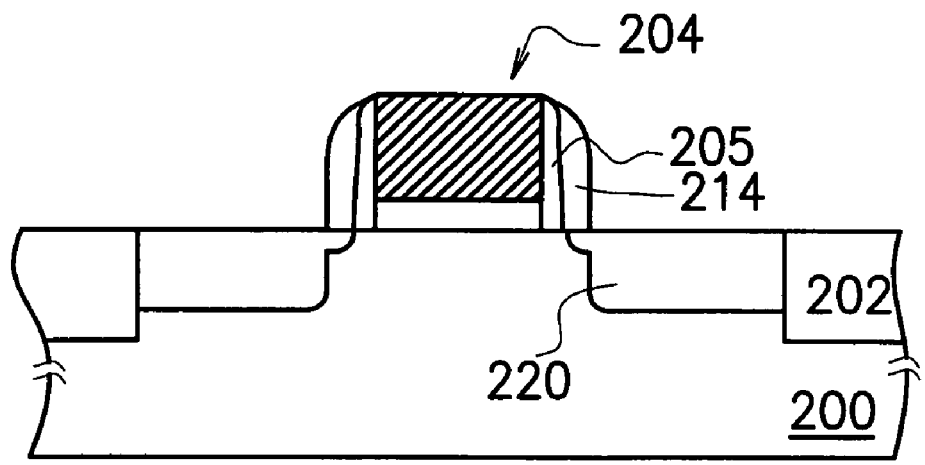

As shown in FIG. 2E and step S114 in FIG. 1, a pre-annealing operation on the substrate 200 is carried out. In the pre-annealing operation, an annealing temperature smaller than the operating temperature of a subsequent solid phase epitaxial process is used. The pre-annealing operation is carried out, for example, by placing the substrate 200 inside a furnace, heating the substrate 200 to a temperature between 400° C. to 450° C. and maintaining at this temperature for a period of about 30 minutes.

As shown in FIG. 2E and step S116 in FIG. 1, a solid phase epitaxial process is carried out to re-crystallize the amorphized region 208 in the substrate 200 into a polysilicon and activate the doped source/drain extension region 212 and the doped source/drain region 218 to form a source/drain terminal 220 with an extension region. The solid phase epitaxial process is performed at a temperature between 550° C. to 600° C. for a period between 30 to 90 minutes, for example.

In the aforementioned method of fabricating a MOS transistor, a pre-annealing operation is carried out before the solid phase epitaxial process so that crystal nuclei are formed within the amorphized region 208. Hence, in the solid phase epitaxial process, large crystals are grown from these crystal nuclei resulting in a considerable reduction of sheet resistance in the source/drain terminals.

Figure 3:
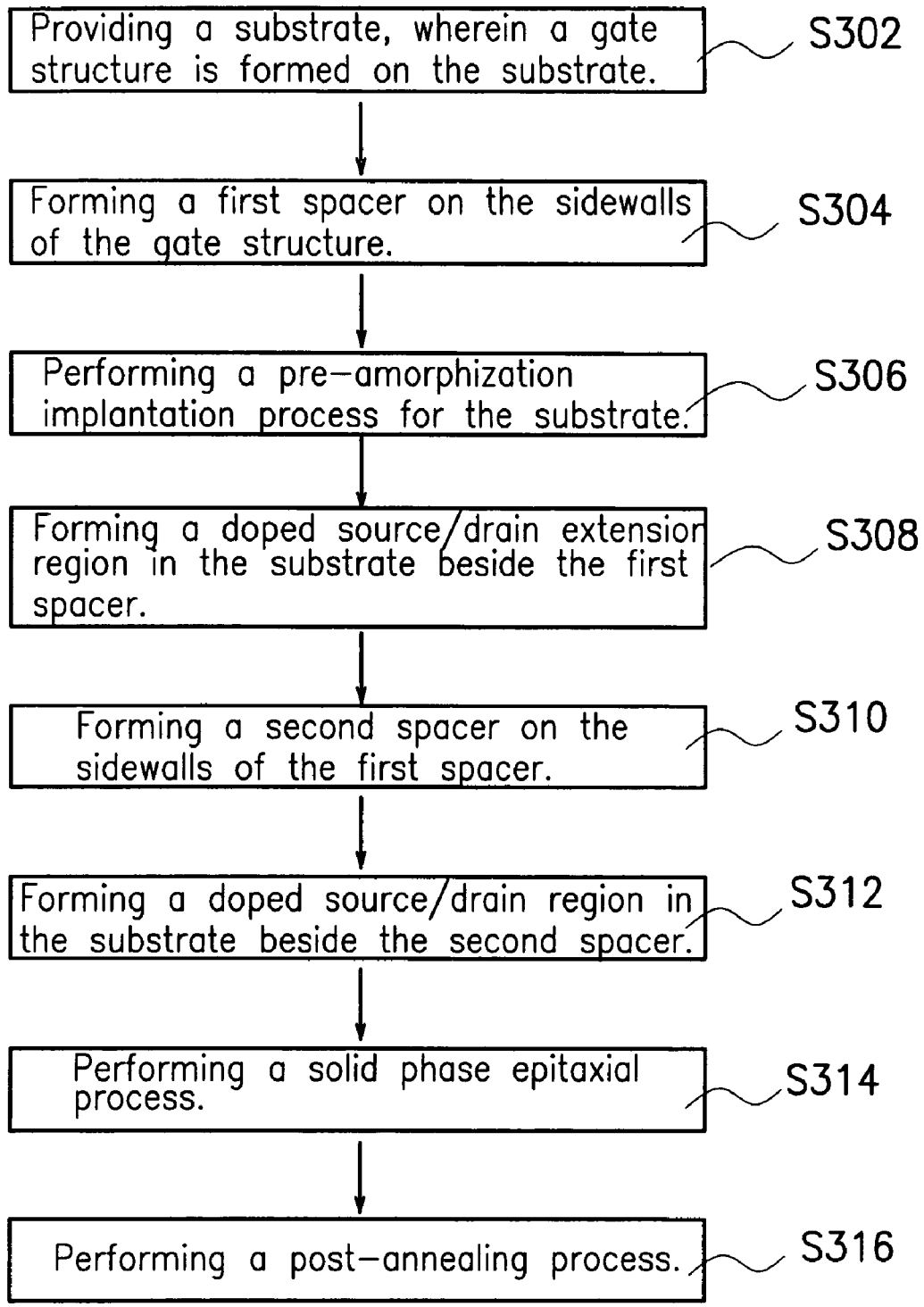
FIG. 3 is a flowchart showing the steps for fabricating a metal-oxide-semiconductor transistor according to a second preferred embodiment of this invention.

Aside from the aforementioned embodiment of this invention, an alternative method of fabricating a MOS transistor is also provided. FIG. 3 is a flowchart showing the steps for fabricating a metal-oxide-semiconductor transistor according to a second preferred embodiment of this invention. Similarly, FIGS. 2A to 2E can be used to illustrate the method of forming the MOS transistor according to the second embodiment.

As shown in FIG. 2A and step S302 in FIG. 3, a substrate 200 such as a silicon substrate with a shallow trench isolation region 202 therein and a gate structure 204 comprising a gate insulation layer and a gate thereon is formed over the substrate 200.

Thereafter, in step S304 of FIG. 3, a first spacer 205 is formed on the sidewalls of the gate structure 204. The first spacer 205 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas.

As shown in FIG. 2B and step S306 of FIG. 3, a pre-amorphization implantation 206 of the substrate 200 is carried out using dopants including, for example, germanium ions. The pre-amorphization implantation 206 is an ion implantation that implants germanium ions into the substrate 200 to form an amorphized region 208. In the pre-amorphization implantation 206, germanium ions are implanted at a dosage level between $2*10^{14}$ atoms/cm$^2$ to $1*10^{15}$ atoms/cm$^2$ and at an implantation energy level between 25 KeV to 45 KeV.

As shown in FIG. 2C and step S308 in FIG. 3, a doped source/drain extension region 212 is formed in the substrate 200 on each side of the first spacer 205. The doped source/drain extension region 212 is formed, for example, by performing an ion implantation process 210 using the gate structure 204 and the first spacer 205 as a mask. In the ion implantation 210, N-type or P-type ions can be used according to the desired state of the device. If N-type ions such as arsenic are used in the implantation, an implantation dosage of between $5*10^{14}$ atoms/cm$^2$ to $2*10^{15}$ atoms/cm$^2$ and an implantation energy level of between 3 to 5 KeV can be used. On the other hand, if P-type ions such as fluoroboride ions are used, an implantation dosage of between $5*10^{14}$ atoms/cm$^2$ to $2*10^{15}$ atoms/cm$^2$ and an implantation energy level of between 1 to 2 KeV can be used.

As shown in FIG. 2D and in step S310 in FIG. 3, a second spacer 214 is formed on the sidewall of the first spacer 205. The second spacer 214 is formed, for example, by depositing dielectric material over the substrate 200 to form a dielectric layer (not shown) and then etching back the dielectric layer in an anisotropic dry etching process. The dielectric layer is formed, for example, by performing a plasma-enhanced chemical vapor deposition (PECVD) process at a temperature of around 400° C. using tetra-ethyl-ortho-silicate (TEOS) as the reactive gas. Alternatively, the second spacer 214 is formed, for example, by performing a rapid thermal annealing process or heating inside a furnace at a temperature exceeding 700° C. Thereafter, germanium ions are implanted into the substrate 200 to break up any re-crystallized silicon in the amorphized region 208 during the annealing operation.

As shown in FIG. 2D and step S312 in FIG. 3, a doped source/drain region 218 is formed in the substrate 200 on each side of the second spacer 214. The doped source/drain region 218 is formed, for example, by performing an ion implantation process 216 using the gate structure 204, the first spacer 205 and the second spacer 214 as a mask. In the ion implantation 216, N-type or P-type ions can be used according to desired state of the device. If N-type ions such as phosphorus ions are used in the implantation, an implantation dosage of between $2*10^{13}$ atoms/cm$^2$ to $4*10^{13}$ atoms/cm$^2$ and an implantation energy level of between 35 to 45 KeV can be used. If N-type ions such as arsenic ions are used in the implantation, an implantation dosage of between $2*10^{15}$ atoms/cm$^2$ to $4*10^{15}$ atoms/cm$^2$ and an implantation energy level of between 35 to 45 KeV can be used. On the other hand, if P-type ions such as boron ions are used, an implantation dosage of between $7*10^{13}$ atoms/cm$^2$ to $4*10^{15}$ atoms/cm$^2$ and an implantation energy level of between 5 to 12 KeV can be used. If P-type ions such as fluoroboride ions are used, an implantation dosage of between $5*10^{14}$ atoms/cm$^2$ to $1*10^{15}$ atoms/cm$^2$ and an implantation energy level of between 12 to 18 KeV can be used.

As shown in FIG. 2E and step S314 in FIG. 3, a solid phase epitaxial process is carried out to re-crystallize the amorphized region 208 in the substrate 200 into a polysilicon and activate the doped source/drain extension region 212 and the doped source/drain region 218 to form a source/drain terminal 220 with an extension region. The solid phase epitaxial process is performed at a temperature between 550° C. to 600° C. for a period between 30 to 90 minutes, for example.

As shown in FIG. 2E and step S316 in FIG. 3, a post-annealing operation on the substrate 200 is carried out at an annealing temperature greater than the operating temperature in the solid phase epitaxial process. For example, a rapid thermal annealing operation is carried out at a temperature of about 850C for about 20 seconds. Alternatively, a spike temperature between 900° C. to 1000° C. is used to carry out the annealing process.

In the aforementioned method of fabricating a MOS transistor, a post-annealing operation is carried out after the solid phase epitaxial process. Hence, distance separating the source/drain region and the extension region is reduced so that the transistor is provided with a sufficiently large gate overlap capacitance and saturated drain current. Ultimately, electrical performance of the transistor is improved.

Figure 4:
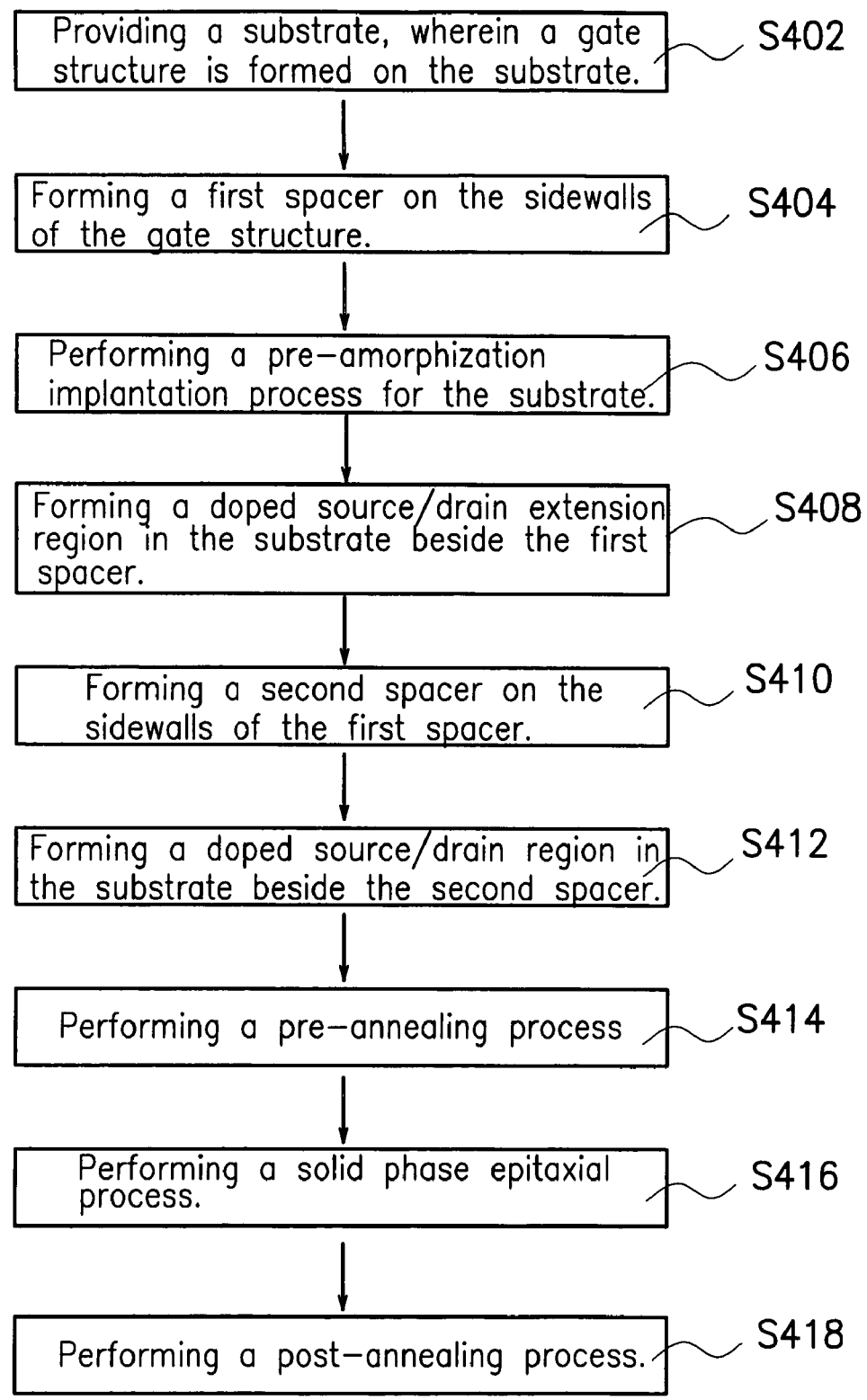
FIG. 4 is a flowchart showing the steps for fabricating a metal-oxide-semiconductor transistor according to a third preferred embodiment of this invention.

Aside from the aforementioned embodiment of this invention, an alternative method of fabricating a MOS transistor is also provided. FIG. 4 is a flowchart showing the steps for fabricating a metal-oxide-semiconductor transistor according to a third preferred embodiment of this invention. As shown in FIG. 4, step S402 to step S418 is carried out in sequence to form a MOS transistor. In short, the process involves the following steps: providing a substrate with a gate structure thereon; forming a first spacer on the sidewall of the gate structure; performing an amorphization implantation to amorphize a portion of the substrate; forming a doped source/drain extension region in the substrate, a second spacer on the sidewall of the first spacer and a doped source/drain region in the substrate in sequence; performing a pre-annealing operation; performing a solid phase epitaxial process and finally performing a post-annealing operation.

In the aforementioned method of fabricating a MOS transistor, a pre-annealing operation is carried out before the solid phase epitaxial process and a post-annealing operation is carried out after the solid phase epitaxial process. Hence, the source/drain terminal of the transistor has a lower sheet resistance and an improved electrical performance.

Furthermore, in the aforementioned embodiments, both the first spacer and the second spacer have a single layer structure. However, depending on the actual processing requirement and design need (for example, a P-type field effect transistor), the first spacer or the second spacer can have a double-layered structure.

Obviously, the aforementioned methods for producing a MOS transistor can be applied to manufacture other semiconductor transistor devices with a reduced electrical resistance.

In conclusion, this invention includes at least the following advantages:

1. A pre-annealing operation is carried out before the solid phase epitaxial process so that the amorphized region is re-crystallized to form large crystals. Hence, sheet resistance at the source/drain terminal of the MOS transistor is greatly reduced.
2. A post-annealing operation is carried out after the solid phase epitaxial process so that the distance between the source/drain region and the extension region of the transistor is reduced. Thus, the electrical performance of the transistor is greatly improved.
3. The MOS transistor of this invention utilizes a solid phase epitaxial process to activate the dopants within the source/drain region. Since the solid phase epitaxial process has a low thermal budget, transition stage acceleration and short channel effect resulting from using a high-temperature annealing process can be prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a metal-oxide-semiconductor (MOS) transistor, comprising the steps of:
    providing a substrate having a gate structure thereon;
    forming a first spacer on the sidewall of the gate structure;
    performing a pre-amorphization implantation to amorphize a portion of the substrate;
    performing an ion implantion to form a doped source/drain extension region in the substrate on each side of the first spacer;
    forming a second spacer on the sidewall of the first spacer;
    forming a doped source/drain region in the substrate on each side of the second spacer;
    performing a solid phase epitaxial process to re-crystallize the amorphized portion of the substrate and activate the doped source/drain extension region and the doped source/drain region to form a source/drain terminal; and
    performing a post-annealing process, wherein the annealing temperature in the post-annealing operation is higher than the operating temperature in the solid phase epitaxial process.

2. The method of claim 1, wherein the post-annealing operation comprises performing a rapid thermal annealing process.

3. The method of claim 1, wherein the post-annealing process comprises heating the substrate to an annealing temperature of about 850° C.

4. The method of claim 3, wherein the post-annealing process comprises maintaining the substrate at the annealing temperature for a period of about 20 seconds.

5. The method of claim 1, wherein the post-annealing process comprises heating the substrate to an annealing temperature between about 900° C. to 1000° C.

6. The method of claim 5, wherein the post-annealing process comprises maintaining the substrate at the annealing temperature for a spike period.

* * * * *